INVENTORS
EDWARD C. BRAUN
JOHN. W. HERLINGER
BY Darby & Darby
ATTORNEYS

INVENTORS
EDWARD C. BRAUN
JOHN W. HERLINGER
BY Darby & Darby
ATTORNEYS 2,967,235
Patented Jan. 3, 1961

2,967,235

RADIO TUNER WITH COMPENSATED FREQUENCY VERSUS GAIN CHARACTERISTIC

Edward C. Braun, Cincinnati, Ohio, and John W. Herlinger, Fort Thomas, Ky., assignors to Avco Corporation, Cincinnati, Ohio, a corporation of Delaware Filed Jan. 5, 1960, Ser. No. 642
5 Claims. (Cl. 250—20)

The present invention relates to radio tuners wherein special provision is made to compensate for the inherent characteristics of component stages of the tuner which would cause the tuner to have substantially different gain characteristics at different frequencies within its operating frequency range.

Radio frequency tuners often exhibit an undesirable characteristic in that their gain varies with frequency. The degree of variation is greater for certain types of electron tube characteristics; the problem is particularly acute in circuits utilizing miniature 26.5 volt electron tubes. In such circuits a variation of 12 to 16 db per octave of frequency is sometimes found in variable inductance type tuners.

Variation of gain with frequency of the foregoing magnitude in the radio frequency tuner of a radio receiver circuit requires some correction in order to obtain acceptable radio equipment performance.

The present invention provides a novel means of compensating for inherent variation of gain with frequency in radio frequency tuners. It is applicable to many types of radio tuners in which this problem appears and is not limited to circuits employing 26.5 volt tubes. The invention is applicable to variable inductance type tuners and others in which the gain decreases with increased frequency, and is also applicable to types of circuits in which gain increases with increases of frequency.

According to the invention, compensation of gain-frequency characteristics is obtained by utilizing the characteristics is obtained by utilizing the characteristic of the mixer tube circuit which causes the intermediate frequency output signal of the mixer to have a magnitude strongly dependent upon the magnitude of the local oscillator input signal. This allows the local oscillator to be designed to have a predetermined amplitude-frequency characteristic and to control the effective gain of the mixer stage in such a way as to compensate for undesirable frequency-characteristics which would otherwise be exhibited by the radio frequency tuner, due to the frequency-gain characteristic of the radio frequency amfplifier stage for example.

As the local oscillator frequency is uniquely related to the tuner input frequency, substantially any desired frequency-gain compensation can be achieved by appropriate selection of the frequency-amplitude characteristic of the local oscillator.

In addition to the previously described features and advantages of the invention, it is an object of the invention to provide a radio frequency tuner having a substantially flat radio-frequency to intermediate-frequency conversion gain over an appreciable range of frequencies.

It is a further object of the invention to provide a radio frequency tuner having such a flat gain characteristic wherein the average over-all gain in the tuned frequency band is improved. It is a still further object of the invention to provide such a flat gain radio frequency tuner wherein the average conversion gain is increased over that of a radio frequency tuner having a frequency-dependent gain characteristic.

Other objects and advantages will be apparent from a consideration of the following description in conjunction with the appended drawings in which.

For convenience, the following description is directed to a particular embodiment of the invention designed for use with a radio receiver for the reception of audio frequency modulated radio signals. It will be appreciated, however, that the invention is not limited to such receivers but may readily be adapted to television receivers or any other radio frequency signal receiving apparatus.

Figure 1:
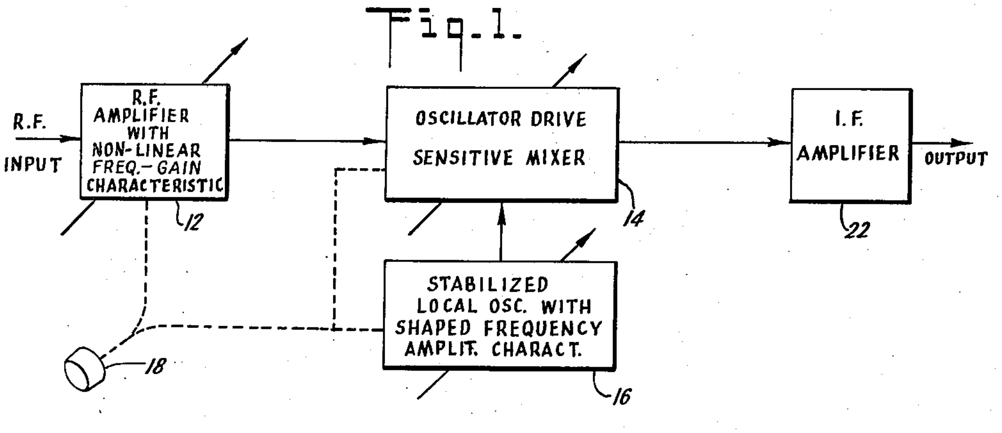
Figure 1 shows a schematic block diagram of a portion of a radio receiver incorporating the principles of the present invention.

Referring now to Figure 1, a block diagram of several stages of a radio frequency receiver to which the principles of the present invention are applied is shown.

A radio frequency input signal as might be received from a radio antenna is supplied to an RF (radio frequency) amplifier 12. The RF amplifier 12 has a non-linear frequency-gain characteristic. This is not an intentional design feature of the amplifier but is rather a necessary consequence of the selection of a certain type of circuit having other desirable advantages. The operation of the RF amplifier 12 does not enter into the operation of the invention except that it inherently has a non-linear frequency-gain characteristic which is compensated by the present invention.

The output of the RF amplifier 12 is supplied to a mixer 14. The mixer 14 is a mixer having a conversion gain characteristic which is sensitive to local oscillator drive amplitude. A pentode mixer with suppressor grid local oscillator signal injection is an example of such an oscillator-drive sensitive mixer, if it is operated at a local oscillator drive amplitude below the peak conversion gain point. Pentode suppressor grid injection mixers are normally operated beyond the peak conversion gain point (point A in Figure 3) to increase stability and to minimize variation between receivers in production due to tube and other component tolerances. In the practice of the present invention it is required to operate the pentode suppressor grid mixer at a local oscillator drive voltage lying along the relatively steep slope of the conversion gain versus oscillator drive voltage characteristic (point B in Figure 3).

The mixer 14 is supplied with a local oscillator signal from the local oscillator 16. The output from the local oscillator 16 which is supplied to the mixer 14 has a frequency dependent amplitude. This is achieved by the design of the local oscillator and/or the insertion of a frequency responsive attenuator between the output of the local oscillator and the input to the mixer.

The RF amplifier stage, the mixer stage, and the local oscillator stage are simultaneously tunable as by a tuning control 18 in accordance with customary practice. Accordingly, the amplitude required at any given local oscillator frequency to provide the necessary conversion gain at the corresponding radio frequency receiver frequency in order to compensate for nonlinear-gain characteristics of the RF amplifier 12 and other portions of the circuit may readily be determined. As a result the circuit may be designed to supply substantially uniform gain to the IF amplifier 22 throughout the operating frequency range of the receiver. This allows the receiver sensitivity to be established at a level limited only by the front end noise figure.

Figure 2:
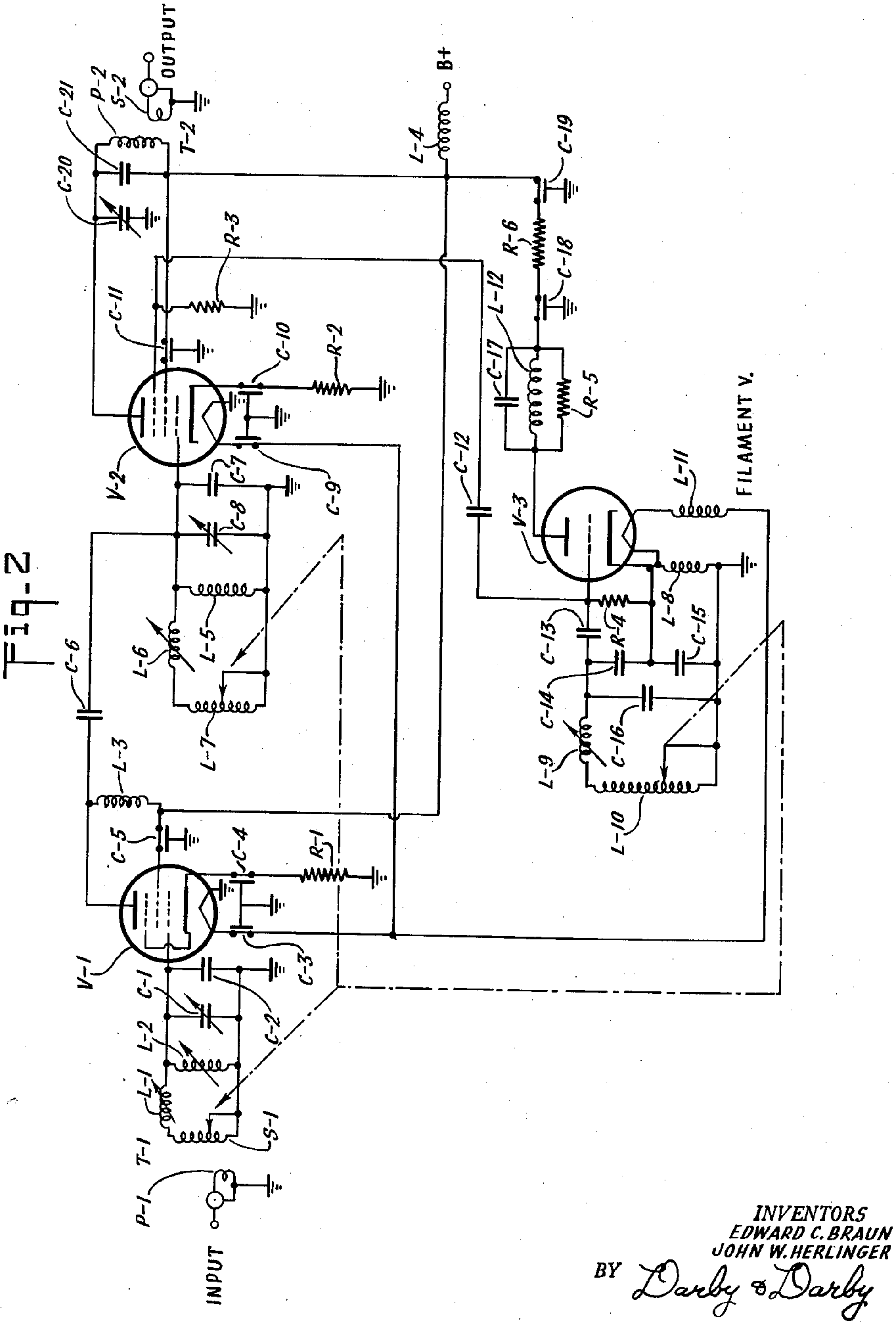
Figure 2 is a schematic circuit diagram showing a particular embodiment of the present invention.

A specific embodiment of the invention is illustrated in Figure 2. A schematic circuit diagram of a radio frequency tuner is shown which is continuously variable over the range of 50 to 80 meg. The intermediate frequency output of the tuner is 10.7 meg. and the local oscillator output is variable from 39.3 to 69.3 megacycles (the expression meg. indicating megacycles, as used herein).

The input to the circuit of Figure 1, which may be derived from a radio antenna for example, is supplied to the primary P–1 of a transformer T–1. The secondary S–1 of the transformer T–1 is a variable inductance winding which is varied to tune the frequency of the input to the radio frequency amplifier stage of the circuit. Variable inductances L–1 and L–2 are provided together with a variable capacitor C–1 and are utilized for trimming the resonant input circuit of the radio frequency stage. The resonant input circuit is completed by capacitor C–2.

The radio frequency input signal is supplied to the control grid of the radio frequency amplifier tube V–1. Bypass condensers C–3, C–4 and C–5 are provided for the heater, cathode, and screen grid respectively of the tube V–1.

The cathode of V–1 is connected through cathode resistor R–1 to ground. The plate of the radio frequency amplifier tube V–1 is connected to the B+ power supply through radio frequency choke coil L–3 and radio frequency choke coil L–4. The screen grid of radio frequency amplifier tube V–1 is connected to the B+ power supply only through the latter radio frequency choke coil.

The radio frequency amplifier circuit associated with vacuum tube V–1 in Figure 2 is shown by way of example but the application of the invention is in no way limited to radio frequency amplifier circuits of this type and in fact the only significance of the particular radio frequency amplifier stage shown is that it has an inherently nonlinear frequency-gain characteristic which makes it desirable to provide compensation according to the present invention.

The output of the radio frequency amplifier stage is supplied from the plate of tube V–1 through capacitor C–6 to the grid of vacuum tube V–2.

The grid circuit of tube V–2 is a resonant circuit comprising capacitors C–7, C–8, and inductances L–5, L–6 and L–7. The variable inductance L–7 is ganged with the transformer secondary S–1 for tuning of the receiver. Bypass condensers C–9, C–10 and C–11 are provided respectively between ground and the filament, cathode, and screen grid of tube V–2. The cathode of V–2 is connected to ground through resistor R–2.

The V–2 (which may be type 5908, for example) functions as a pentode mixer with a suppressor grid-injected local oscillator signal. Accordingly, the suppressor grid of tube V–2 is connected to receive the local oscillator signal from tube V–3 through coupling capacitor C–12, as it appears across suppressor grid resistor R–3 connected between the suppressor grid and ground.

The local oscillator output for the mixer tube V–2 is taken from the grid of tube V–3. Tube V–3 is connected in a modified Coupitts oscillator circuit. The resonant RLC network for the circuit of tube V–3 comprises capacitors C–13, C–14, C–15 and C–16, resistor R–4 and inductances L–8, L–9 and L–10. Inductance L–10 is variable in conjunction with inductance L–7 and transformer secondary S–1 for tuning of the radio frequency tuner. A filament choke coil L–11 is provided in the filament circuit of the tube V–3.

The frequency-amplitude characteristic of the oscillator circuit of tube V–3 is modified to obtain the desired characteristic by proper selection of the parameters of the RLC network in the plate circuit of the tube V–3. This network comprises capacitors C–17, C–18 and C–19, inductance L–12 and resistors R–5 and R–6.

The proper selection of circuit parameters for the elements in the plate circuit of the V–3 may be made empirically or by reference to known techniques for calculation of desired values or both.

Techniques useful in the design of the oscillator circuit and other portions of the radio frequency tuner may be found in Applied Electronics, second edition, by Gray, page 660 et seq.; Radio Receiver Design, K. R. Sturley, part 1, 4th impression, pages 180–195; Handbook of Semiconductor Electronics, Hunter, 1st edition, pages 14–1 to 14–5; and Vacuum Tube Circuits and Transistors, Arguimbau, copyright 1956, page 373.

The output of the local oscillator circuit comprising tube V–3 and having a predetermined frequency-amplitude characteristic is supplied to the suppressor grid of the tube V–2 where it mixes with the input from the radio frequency amplifier circuit of tube V–1 supplied to the control grid of tube V–2. The output of tube V–2 is supplied to an output circuit in the plate circuit of V–2 tuned to the IF frequency. This circuit comprises capacitors C–20 and C–21 together with the primary P–2 of transformer T–2. The intermediate frequency output from the radio frequency tuner is available at the secondary S–2 of the transformer T–2.

A table of values of circuit parameters for the elements in the circuit of Figure 2 is given below. Values of the elements of the conventional radio frequency amplifier are omitted for simplicity.

*Table**

| Element | Value | Element | Value |
|---|---|---|---|
| C–6 | 100 | R–3 | 100,000 |
| C–7 | 24 | R–4 | 100,000 |
| C–8 | 1–12 | R–5 | 680 |
| C–9 | 1000 | R–6 | 680 |
| C–10 | 1000 | L–4 | 2.8 |
| C–11 | 1000 | L–5 | 1.04 |
| C–12 | 10 | L–6 | .0056 |
| C–13 | 97 | L–7 | .104–.323 |
| C–14 | 75 | L–8 | 2.8 |
| C–15 | 75 | L–9 | .0056 |
| C–16 | 15 | L–10 | .104–.328 |
| C–17 | 22 | L–11 | 2.8 |
| C–18 | 1000 | L–12 | .65 |
| C–19 | 1000 | P–2(L) | 18.5 |
| C–20 | 1–12 | V–2 | 5908 |
| C–21 | 8.2 | V–3 | 5904 |
| R–2 | 270 | | |

* Capacitances in micro-farads, resistances in ohms, inductances in microhenries, tubes identified by type number.

Figure 3:
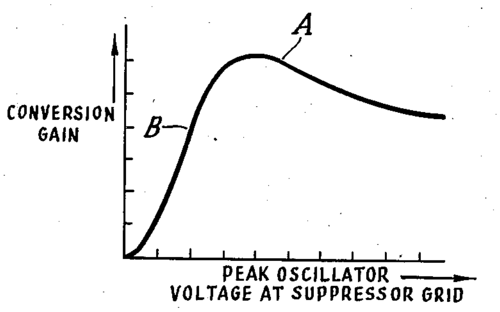
Figure 3 is a typical mixer conversion gain versus peak oscillator voltage diagram presented to aid in the explanation of the invention.

It is customary to operate a mixer tube such as V–2 at a sufficiently high peak oscillator voltage supplied to the suppressor grid, so that it operates in the region to the right of point A in Figure 3. This is done to improve stability and to avoid difficulties due to differences in It should be noted that any source of oscillator signal may be utilized in the practice of the present invention provided only that the signal has or can be modified to have the desired frequency-amplitude characteristics.

While the present invention is explained throughout with reference to vacuum tube circuits, it will be understood that the invention may be applied to circuits employing other elements such as transistors in place of vacuum tubes. As the principles of the invention may be applied to transistor circuits by the application of known transistorization techniques, it is intended that the scope of the invention shall include circuits according to the invention utilizing transistors or other than vacuum tube amplifying devices.

Figure 4:
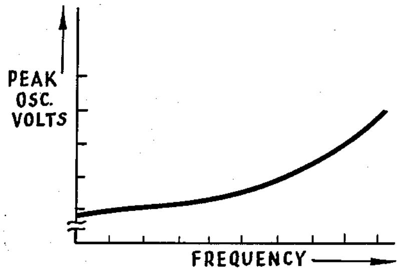
Figure 4 is a typical oscillator amplitude versus frequency curve for an oscillator having a compensating plate network presented to aid in the explanation of the present invention.
Figure 5:
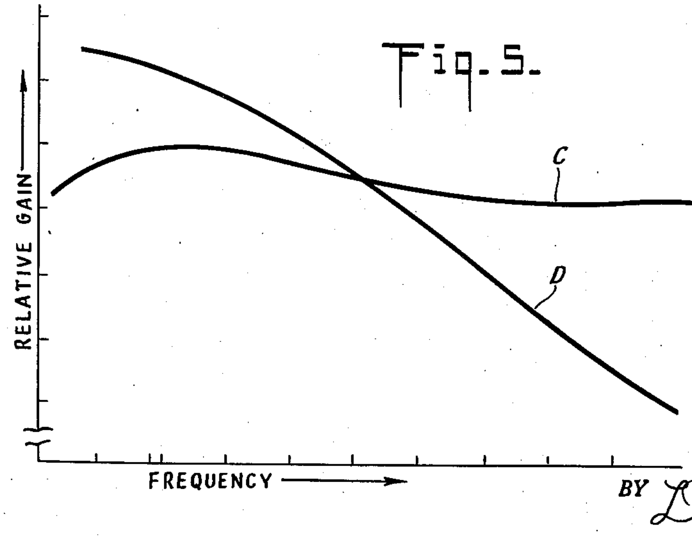
Figure 5 is a diagram showing relative gain versus frequency for radio frequency tuners incorporating the present invention as compared with those not incorporating the present invention.

The operation of the circuit of Figure 2 may be better understood by reference to Figures 3, 4 and 5. Figure 3 shows a typical mixer conversion gain versus peak oscillator voltage curve for a mixer tube such as V–2.

sets in production resulting from variation of component parameters within ordinary manufacturing tolerances. The present invention departs from the usual practice and provides means whereby the tube V–2 may be operated with a lessor peak oscillator voltage supplied to the suppressor grid, so that it operates on the region of the curve in the vicinity of point B in Figure 3.

Due to the steep slope of the curve in the vicinity of point B, small variations in oscillator voltage will produce substantial variations in conversion gain. This enables the tube V–2 to operate in conjunction with the oscillator circuit of tube V–3 as a frequency-gain characteristic compensator.

Referring for example to Figure 4, the oscillator circuit of tube V–3 is designed to have an increasing output with frequency. Thus, with increases in radio frequency tuner frequency setting, the oscillator frequency is increased with a corresponding increase in oscillator output. Increases in oscillator output applied to the suppressor grid of tube V–2 cause increases in the gain of the mixer circuit associated with tube V–2.

Referring to Figure 5, a radio frequency tuner circuit of the general type shown in Figure 2 without the compensating features of the present invention would have a relative gain versus frequency characteristic as indicated by the sloping line D. As previously explained, however, the compensation provided by the present invention causes an increase in gain with increasing frequency, thus leveling out the frequency-gain characteristic as indicated by the line C in Figure 5. It will be further noted that the gain area under the line C is appreciably greater than that under the line D, indicating that the average gain of the circuit over the frequency range need not be diminished by adding the compensation feature according to the present invention.

The present invention can be applied to circuits of numerous different types having various types of frequency-gain characteristics for which compensation is desired.

In applying the present invention to compensate a particular radio frequency circuit the designer might proceed as follows. First, ascertain the approximate frequency-gain characteristic which was to be achieved (usually as flat as possible). Second, determine the frequency-gain characteristic of the circuit in question before compensation. Third, with constant radio frequency input to the mixer stage, determine the local oscillator drive versus conversion gain characteristic of the stage. Fourth, design or modify the oscillator circuit to provide a frequency-amplitude characteristic which, superimposed upon the mixer oscillator drive-conversion gain characteristic, will provide the desired compensation.

Obviously, certain factors such as tuner frequency range, local oscillator frequency, required IF input level, and the like, will be more or less determined by the nature of the problem.

From the foregoing explanation, it will be seen that the present invention provides a simple and efficient means for compensating a radio frequency tuner or like circuit to provide a desired frequency-gain characteristic for the tuner even though the circuit by its nature tends to depart from the desired characteristic. For example, it is common practice, particularly in broadcast radio receivers, to feed the radio frequency signal directly to the mixer without an intervening radio frequency amplifier stage. The present invention is applicable to such tuners. It will be appreciated that numerous variations in addition to those described or suggested will be apparent to those of ordinary skill in the art, and accordingly, it is desired that the scope of the present invention not be limited to particular embodiments shown but only by the appended claims.

What is claimed is:

1. A radio frequency tuner for a radio frequency signal receiver having frequency-gain characteristic compensation comprising an inductance tunable radio frequency vacuum tube amplifier stage, an inductance tunable mixer stage comprising a pentode vacuum tube arranged for suppressor grid local oscillator signal injection and having an oscillator drive-conversion gain characteristic with a relatively steeply sloped portion, said mixer stage being connected to receive the radio frequency output of said radio frequency amplifier stage, a variable-frequency vacuum tube local oscillator circuit connected to provide a local oscillator signal to the suppressor grid of said pentode tube, said local oscillator signal supplied to said pentode tube being of an amplitude to cause said mixer to operate at a point on the steeply sloped portion of its oscillator drive-conversion gain characteristic, means for simultaneously varying the tuning of said radio frequency amplifier, said mixer and said local oscillator circuit, and means for causing variation of the amplitude of output of said local oscillator circuit supplied to said pentode tube and displacement of said point with changes in output frequency of said local oscillator circuit, whereby a predetermined desired relation of mixer gain with frequency is produced in said radio frequency tuner to effect a desired frequency-gain characteristic compensation for said radio frequency tuner.

2. A radio frequency tuner for a radio frequency signal receiver having frequency-gain characteristic compensation comprising a tunable radio frequency vacuum tube amplifier stage, at unable mixer stage comprising a pentode vacuum tube arranged for suppressor grid local oscillator signal injection and having an oscillator drive-conversion gain characteristic with a relatively steeply sloped portion, said mixer stage being connected to receive the radio frequency output of said radio frequency amplifier stage, a variable-frequency vaccum tube local oscillator circuit connected to provide a local oscillator signal to the suppressor grid of said pentode tube, said local oscillator signal supplied to said pentode tube being of an amplitude to cause said mixer to operate at a point on the steeply sloped portion of its oscillator, drive-conversion gain characteristic, means for simultaneously varying the tuning of said radio frequency amplifier, said mixer stage and said local oscillator circuit, and means for causing variation of the amplitude of output of said local oscillator circuit supplied to said pentode and displacement of said point with changes in output frequency of said local oscillator circuit, whereby a predetermined desired relation of mixer gain with frequency is produced in said radio frequency tuner to effect a desired frequency-gain characteristic compensation for said radio frequency tuner.

3. A radio frequency tuner for a radio frequency signal receiver having frequency-gain characteristic compensation comprising radio frequency amplifier stage, a mixer stage comprising a pentode amplifier tube connected for suppressor grid local oscillator signal injection and having an oscillator drive-conversion gain characteristic with a relatively steeply sloped portion, said mixer stage being connected to receive the radio frequency output of said radio frequency amplifier stage, a variable-frequency local oscillator signal source connected to provide a local oscillator signal to the local oscillator signal input of said mixer, said local oscillator signal supplied to said mixer being of an amplitude to cause said mixer to operate at a point on a relatively steeply sloped portion of its oscillator drive-conversion gain characteristic, and means for causing variation of the amplitude of output of said local oscillator signal source supplied to said mixer with changes in frequency of said local oscillator signal whereby a predetermined desired relation of mixer gain with frequency is produced in said radio frequency tuner to displace said point and effect a desired frequency-gain characteristic compensation for said radio frequency tuner.

4. A radio frequency tuner for a radio frequency signal receiver having frequency-gain characteristic compensation comprising a radio frequency amplifier stage, a mixer stage having an oscillator drive-conversion gain characteristics with a relatively steeply sloped portion and connected to receive the radio frequency output of said radio frequency amplifier stage, a variable-frequency local oscillator signal source connected to provide a local oscillator signal to the local oscillator signal input of said mixer, said local oscillator signal supplied to said mixer being of an amplitude to cause said mixer to operate at a point on a relatively steeply sloped portion of its oscillator drive-conversion gain characteristic, and means for causing variation of the amplitude of output of said local oscillator signal source supplied to said mixer with changes in frequency of said local oscillator signal whereby a predetermined desired relation of mixer gain with frequency is produced in said radio frequency tuner to displace said point and effect a desired frequency-gain characteristic compensation for said radio frequency tuner.

5. A radio frequency tuner for a radio frequency signal receiver having frequency-gain characteristic compensation comprising a mixer stage having an oscillator drive-conversion gain characteristic with a relatively steeply sloped portion and adapted to receive an input signal, a variable-frequency local oscillator signal source connected to provide a local oscillator signal to the local oscillator signal input of said mixer, said local oscillator signal supplied to said mixer being of an amplitude to cause said mixer to operate at a point on a relatively steeply sloped portion of its oscillator drive-conversion gain characteristic, and means for causing variation of the amplitude of output of said local oscillator signal source supplied to said mixer with changes in frequency of said local oscillator signal whereby a predetermined desired relation of mixer gain with frequency is produced in said radio frequency tuner to displace said point and effect a desired frequency-gain characteristic compensation for said radio frequency tuner.

References Cited in the file of this patent

UNITED STATES PATENTS

| | | |
|---|---|---|
| 2,001,694 | Farmham | May 14, 1935 |
| 2,045,569 | Case | June 30, 1936 |
| 2,454,817 | Libby | Nov. 30, 1948 |
| 2,587,667 | Toth | Mar. 4, 1952 |

UNITED STATES PATENT OFFICE
CERTIFICATION OF CORRECTION

Patent No. 2,967,235 January 3, 1961

Edward C. Braun et al.

It is hereby certified that error appears in the above numbered patent requiring correction and that the said Letters Patent should read as corrected below.

Column 1, lines 44 and 45, strike out "is obtained by utilizing the characteristics"; line 56, for "amfplifier" read -- amplifier --; column 4, line 51, in the footnote to the table, for "micro-farads" read -- micro-micro-farads --; lines 53 to 57, inclusive, strike out > "It is customary to operate a mixer tube such as V-2 at a sufficiently high peak oscillator voltage supplied to the suppressor grid, so that it operates in the region to the right of point A in Figure 3. This is done to improve stability and to avoid difficulties due to differences in"

and insert the same at the top of column 5 before line 1; column 5, line 5, for "lessor" read -- lesser --; column 6, line 29, for "at unable" read -- a tunable --; column 7, line 4, for "characteristics" read -- characteristic --.

Signed and sealed thid 6th day of June 1961.

(SEAL)
Attest:

ERNEST W. SWIDER
Attesting Officer

DAVID L. LADD
Commissioner of Patents